(12) United States Patent
Chang

(10) Patent No.: US 7,999,525 B2
(45) Date of Patent: Aug. 16, 2011

(54) VOLTAGE REGULATOR AND METHOD OF MANUFACTURING THE SAME

(75) Inventor: Kee Seok Chang, Daejeon (KR)

(73) Assignee: Taejin Technology Co., Ltd., Daejeon (KR)

( * ) Notice: Subject to any disclaimer, the term of this patent is extended or adjusted under 35 U.S.C. 154(b) by 420 days.

(21) Appl. No.: 11/999,882

(22) Filed: Dec. 7, 2007

(65) Prior Publication Data

US 2008/0309314 A1      Dec. 18, 2008

(30) Foreign Application Priority Data

Jun. 15, 2007   (KR) .................. 10-2007-0058763

(51) Int. Cl.
*G05F 1/40* (2006.01)
*G05F 1/44* (2006.01)

(52) U.S. Cl. ......... 323/282; 323/284; 323/285; 323/286

(58) Field of Classification Search .................. 323/282, 323/284, 285, 286
See application file for complete search history.

(56) References Cited

U.S. PATENT DOCUMENTS

| | | | | |
|---|---|---|---|---|
| 5,231,316 | A  * | 7/1993 | Thelen, Jr. ..................... | 327/103 |
| 5,917,311 | A  * | 6/1999 | Brokaw ........................ | 323/280 |
| 6,774,703 | B2 * | 8/2004 | Mihara ......................... | 327/530 |
| 7,019,585 | B1 * | 3/2006 | Wilson et al. ................. | 327/541 |
| 7,038,523 | B2 * | 5/2006 | Kim et al. ..................... | 327/407 |
| 7,236,042 | B2 * | 6/2007 | Kawagoshi .................... | 327/525 |
| 2004/0032017 | A1* | 2/2004 | Han .............................. | 257/686 |
| 2005/0077923 | A1* | 4/2005 | Kim et al. ........................ | 327/50 |
| 2006/0049856 | A1* | 3/2006 | Nakai et al. ..................... | 327/83 |
| 2006/0279349 | A1* | 12/2006 | Grudin et al. ................. | 327/334 |
| 2009/0045796 | A1* | 2/2009 | Kang et al. .................... | 323/318 |

* cited by examiner

*Primary Examiner* — Bao Q Vu
(74) *Attorney, Agent, or Firm* — Drinker Biddle & Reath LLP

(57) ABSTRACT

A voltage regulator and a method of manufacturing the voltage regulator, which can provide a desired output voltage of the voltage regulator using a plurality of metal wires, arranged in regular patterns, and conductive metal wiring patterns, configured to activate the metal wires by selectively connecting them to each other when a voltage regulator having various output voltage patterns is produced through a single chip, thus reducing the costs of manufacturing the voltage regulator by simplifying the manufacturing process while reducing the size of the chip of the voltage regulator.

9 Claims, 4 Drawing Sheets

$$R_T = R_1 + (R_4 \parallel R_5 \parallel R_6) + R_8$$

VOLTAGE REGULATOR AND METHOD OF MANUFACTURING THE SAME

CROSS-REFERENCE TO RELATED PATENT APPLICATIONS

This application claims the benefit of Korean Patent Application No. 10-2007-0058763, filed on Jun. 15, 2007, in the Korean Intellectual Property Office, the disclosure of which is incorporated herein in its entirety by reference.

FIELD OF THE INVENTION

The present invention relates, in general, to a voltage regulator and a method of manufacturing the voltage regulator, and, more particularly, to a voltage regulator and a method of manufacturing the voltage regulator, which can provide a desired output voltage of the voltage regulator using a plurality of metal wires, arranged in regular patterns, and conductive metal wiring patterns, configured to activate the metal wires by selectively connecting them to each other, when a voltage regulator having various output voltage patterns is produced through a single chip, thus reducing the costs of manufacturing the voltage regulator by simplifying the manufacturing process while reducing the size of the chip of the voltage regulator.

BACKGROUND OF THE INVENTION

Generally, a voltage regulator is a three-pin device, which has an input terminal for inputting power that needs to be stabilized, an output terminal for outputting constant voltage, and a ground terminal, on the outside thereof, and which has a circuit for converting the signal, input through the input terminal, into a stable constant voltage on the inside thereof. Such a voltage regulator has been used in power supply devices of various types of electronic appliances FIG. 1 is a diagram schematically showing the construction of a conventional voltage regulator including trimming pads and fuses.

As shown in FIG. 1, a conventional voltage regulator 10 includes an analog circuit 1 having an amplifier and a transistor, and a voltage division unit 2 having a resistor layer for metal wires, functioning as a plurality of resistors, trimming pads $TP_1$ to $TP_n$, and a plurality of fuses $FUSE_1$ to $FUSE_{n-1}$ capable of electrically shorting the trimming pads $TP_1$ to $TP_n$.

That is, in the voltage division unit 2, the trimming pads $TP_1$ to $TP_n$ are connected in parallel with respective resistors of the resistor layer to activate selected resistors, thus adjusting the voltage division ratio of the voltage division unit 2. The fuses $FUSE_1$ to $FUSE_{n-1}$ are formed to be able to electrically short neighboring trimming pads, among the trimming pads $TP_1$ to $TP_n$, to each other.

However, the conventional voltage regulator 10 is problematic in that, in an actual device, the analog circuit 1 and the voltage division unit 2 are arranged in a horizontal space, and the trimming pads $TP_1$ to $TP_n$ and the fuses $FUSE_1$ to $FUSE_{n-1}$ are separately provided in the voltage division unit 2, which is used to determine the output voltage of the voltage regulator 10, so that the size of the chip of the voltage regulator 10 is increased, and thus the manufacturing costs thereof are increased, and the production yield relative to the amount of material is decreased.

Further, the conventional voltage regulator 10 is designed and produced in the state in which all of the resistors of the resistor layer are deactivated by the trimming pads $TP_1$ to $TP_n$ and the uncut fuses $FUSE_1$ to $FUSE_{n-1}$, and is operated such that the trimming pads $TP_1$ to $TP_n$, connected to each other through the fuses $FUSE_1$ to $FUSE_{n-1}$, are opened by selectively fusing the fuses $FUSE_1$ to $FUSE_{n-1}$ using high current or a laser during a subsequent testing process, thus enabling the resistors, connected in parallel with the opened trimming pads $TP_1$ to $TP_n$, to be activated, and consequently obtaining a required output voltage.

However, the conventional voltage regulator 10 is problematic in that a trimming process for fusing the fuses connected to the trimming pads must be added, thus raising chip manufacturing costs and increasing a lead time.

In addition, the conventional voltage regulator 10 is also problematic in that, during a trimming process performed using high current or laser, the voltage regulator 10 may be subject to latent damage due to high levels of energy.

SUMMARY OF THE INVENTION

Accordingly, the present invention has been made keeping in mind the above problems occurring in the prior art, and an object of the present invention is to provide a voltage regulator, which can provide the desired output voltage of the voltage regulator using a plurality of metal wires, arranged in regular patterns, and conductive metal wiring patterns, adapted to activate the metal wires by selectively connecting the metal wires to each other, without using trimming pads.

Another object of the present invention is to provide a voltage regulator, which enables the size of the chip of the voltage regulator to be reduced at the time of manufacturing the voltage regulator, thus reducing chip manufacturing costs and increasing the production yield relative to the amount of material.

A further object of the present invention is to provide a method of manufacturing a voltage regulator, which enables the voltage regulator to be constructed without using trimming pads and fuses at the time of manufacturing the voltage regulator, so that a trimming process can be omitted, thus simplifying the process of manufacturing the voltage regulator and reducing the manufacturing costs thereof.

In order to accomplish the above objects, the present invention provides a voltage regulator having an input terminal, an output terminal, and a ground terminal, comprising a reference voltage generation unit for generating a reference voltage through the input terminal; a voltage division unit for dividing a voltage of the output terminal using a feedback resistor and active resistors, which are implemented using both a plurality of metal wires, arranged in regular patterns, and conductive metal wiring patterns, configured to activate the metal wires by selectively connecting the metal wires to each other, an amplification unit for receiving the reference voltage, output from the reference voltage generation unit, and a divided voltage, output from the voltage division unit and fed back to the amplification unit, and amplifying a difference between the reference voltage and the divided voltage; and a transistor for transferring power, input through the input terminal, to the output terminal in response to an output voltage of the amplification unit.

Preferably, the metal wires may be formed such that the active resistors of the voltage division unit exhibit all resistance values within a predefined output voltage range of the output terminal, the metal wiring patterns may be formed to select and connect metal wires to each other depending on the desired output voltage, and the metal wires may comprise contacts formed on certain portions thereof, thus connecting to the metal wiring patterns through the contacts.

In addition, the present invention provides a method of manufacturing a voltage regulator, the voltage regulator comprising a reference voltage generation unit, a voltage division unit, an amplification unit, and a transistor, comprising forming a plurality of metal wires and contacts, constituting the voltage division unit, the metal wires being arranged in regular patterns; and forming metal wiring patterns for connecting the transistor, the metal wires, and the contacts to each other through conductive wires.

Preferably, the metal wiring patterns may be formed such that a first metal wiring pattern is formed on a region of the transistor, and a second metal wiring pattern is formed on a region of the metal wires and the contacts.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, embodiments of the present invention will be described in detail with reference to the attached drawings.

Figure 1:
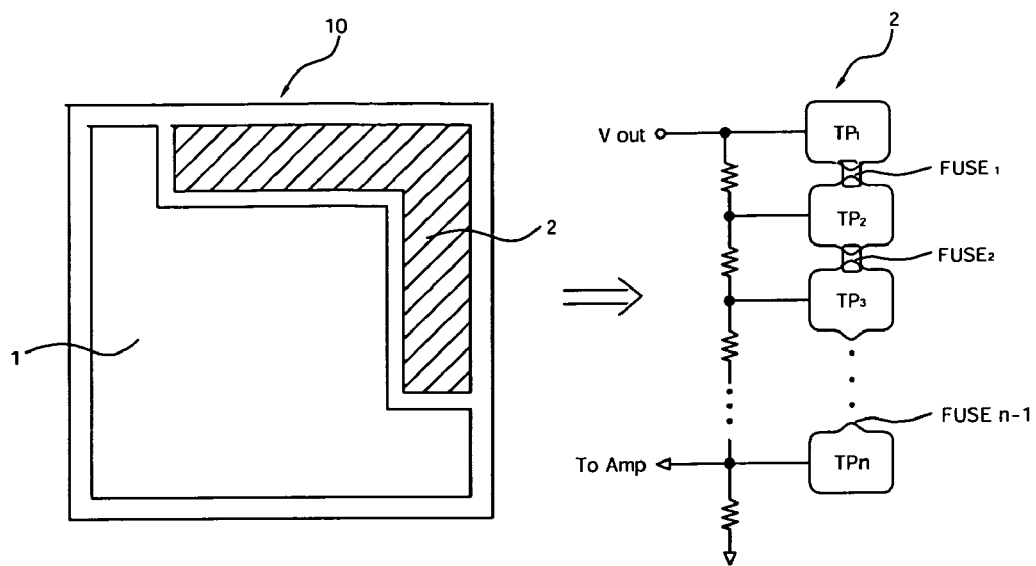
FIG. 1 is a diagram schematically showing the construction of a conventional voltage regulator including trimming pads and fuses.
Figure 2:
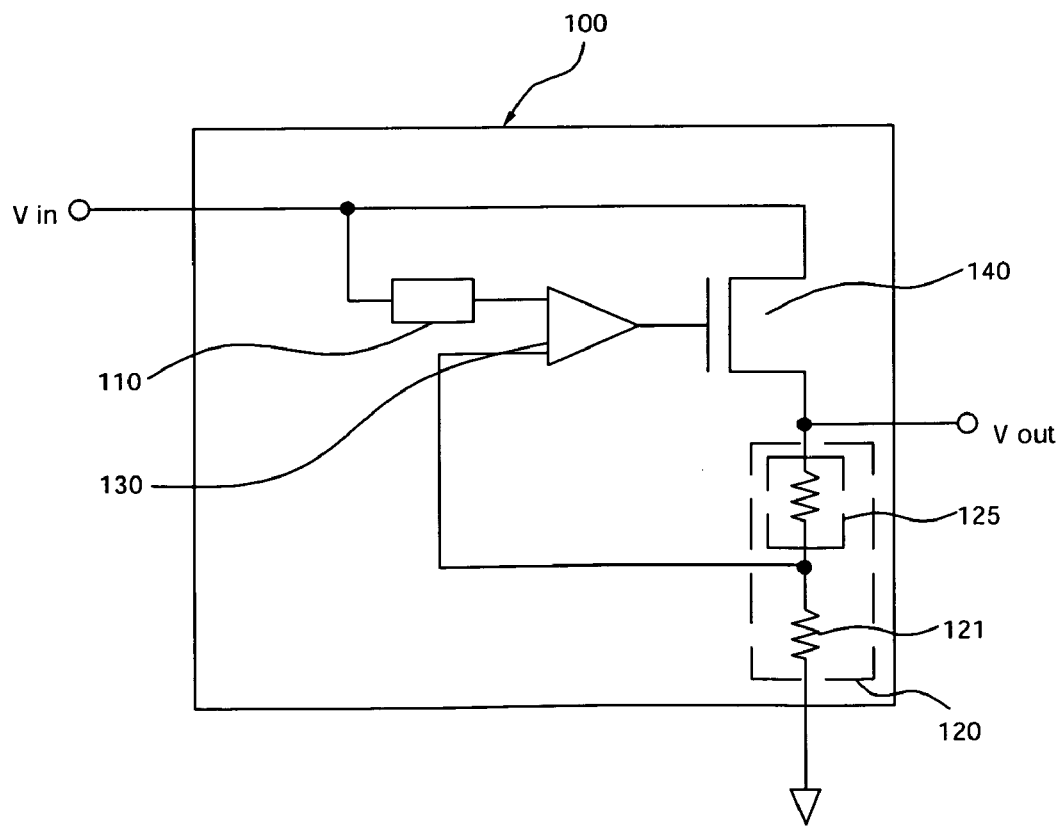
FIG. 2 is a block diagram of a voltage regulator according to the present invention.

FIG. 2 is a block diagram of a voltage regulator according to the present invention.

As shown in FIG. 2, a voltage regulator 100 according to the present invention includes an input terminal Vin, an output terminal Vout and a ground terminal on the outer side thereof, and includes a reference voltage generation unit 110, a voltage division unit 120, an amplification unit 130, and a transistor 140 on the inner side thereof.

The reference voltage generation unit 110 receives a voltage through the input terminal and generates a reference voltage. The amplification unit 130 receives both the reference voltage, output from the reference voltage generation unit 110, and the divided voltage, output from the voltage division unit 120, which will be described later, and thus amplifies the difference between the received signals. The transistor 140 is controlled by the output voltage of the amplification unit 130 to transmit the voltage, input through the input terminal, to the output terminal.

The voltage division unit 120 includes an active resistor 125, implemented using a plurality of metal wires 122 (refer to FIG. 3), arranged in regular patterns, and conductive metal wiring patterns 124 (refer to FIG. 3), adapted to selectively connect some or all of the metal wires 122 to each other to activate the connected metal wires, and a feedback resistor 121. The voltage division unit 120 functions to divide the output voltage of the transistor 140, applied to the output terminal, and to apply the divided voltage to the amplification unit 130.

Here, the metal wires 122 are preferably made of polycrystalline silicon, doped with metal or impurities, and are configured such that, of the plurality of metal wires 122, some metal wires selectively connected to each other by the metal wiring patterns 124 are activated and the remaining metal wires are deactivated.

Figure 3:
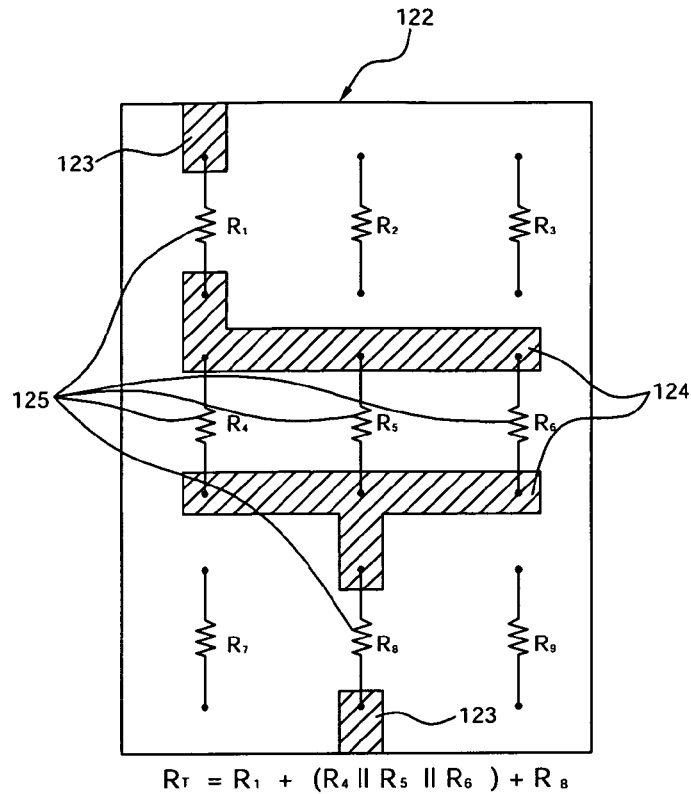
FIG. 3 is a diagram showing an embodiment in which metal wires are activated using metal wiring patterns in the voltage division unit of a voltage regulator according to the present invention.

FIG. 3 is a diagram showing an embodiment in which metal wires are activated using metal wiring patterns in the voltage division unit of a voltage regulator according to the present invention.

As shown in FIG. 3, first to ninth resistors $R_1$ to $R_9$ are arranged as examples of the metal wires 122 constituting the voltage division unit 120, together with the feedback resistor 121.

The same or all of the first to ninth resistors $R_1$ to $R_9$ can be selectively activated, depending on the configuration of the metal wiring patterns 124.

Further, FIG. 3 shows a simple embodiment in which only first to ninth resistors $R_1$ to $R_9$ are indicated as the resistors included in the voltage division unit 120, but it will be apparent that, in an actual device, more resistors can be used to exhibit all resistance values within a range of 5V, which is the typical output voltage range of the voltage regulator.

In FIG. 3, active resistors 125, which are activated among the resistors arranged as the metal wires 122, exhibit a resistance value identical to the sum of the first resistor $R_1$, the fourth to sixth resistors $R_4$ to $R_6$, which are connected in parallel with each other, and the eighth resistor $R_8$, that is, $R_T = R_1 + (R_4 \| R_5 \| R_6) + R_8$.

In this case, the metal wiring patterns 124 are formed to electrically connect the source terminal of the transistor 140 to the first resistor $R_1$, the first resistor $R_1$ to the fourth to sixth resistors $R_4$ to $R_6$, and the fourth to sixth resistors $R_4$ to $R_6$ to the eighth resistor $R_8$, and the eighth resistor $R_8$ to the feedback resistor 121.

Figure 4:
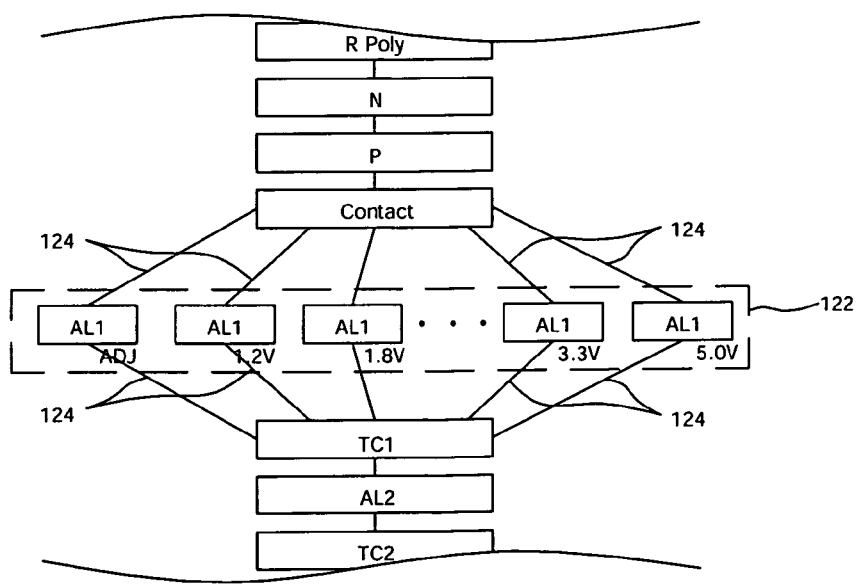
FIG. 4 is a conceptual view showing the construction of the voltage division unit of a voltage regulator according to the present invention.
Figure 5A:
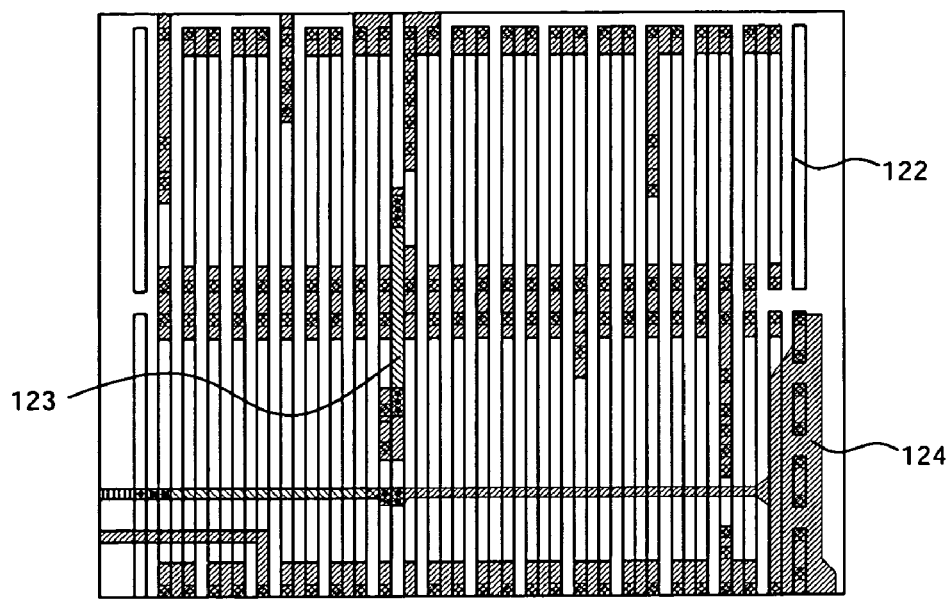
FIGS. 5A to 5D are diagrams showing embodiments in which metal wires are selectively connected to each other using the metal wiring patterns of a voltage regulator according to the present invention.
Figure 5B:
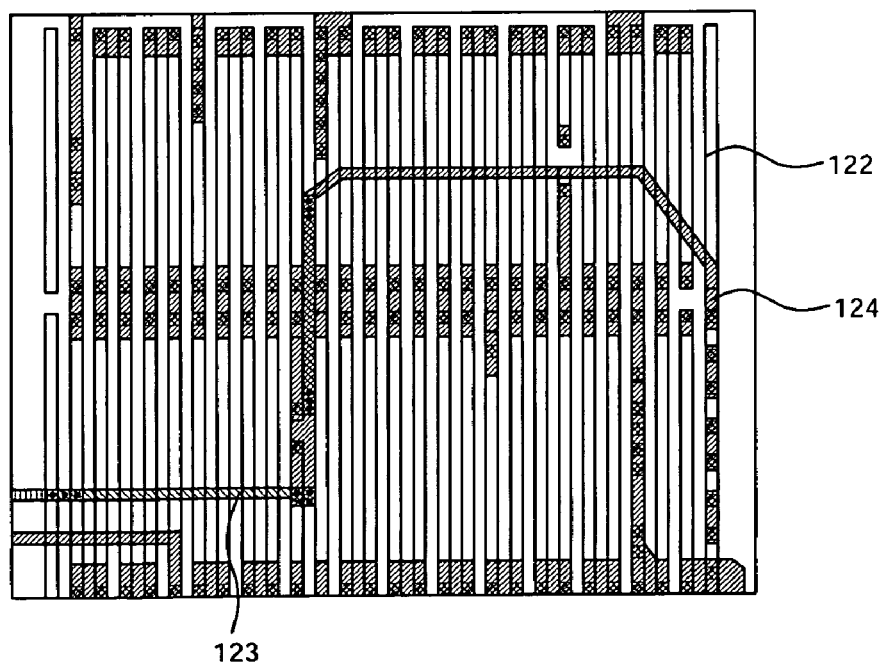
Figure 5C:
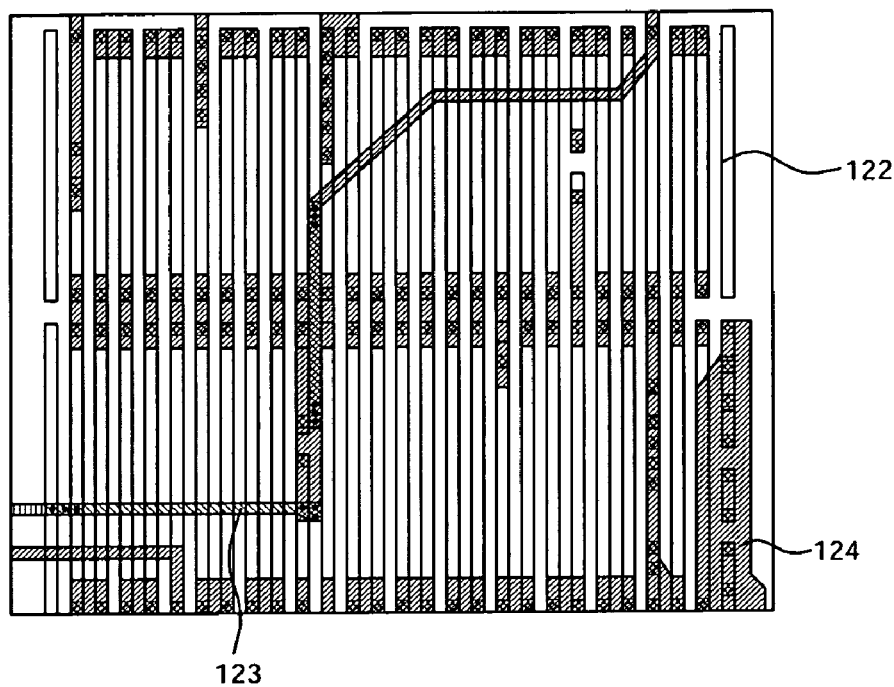
Figure 5D:
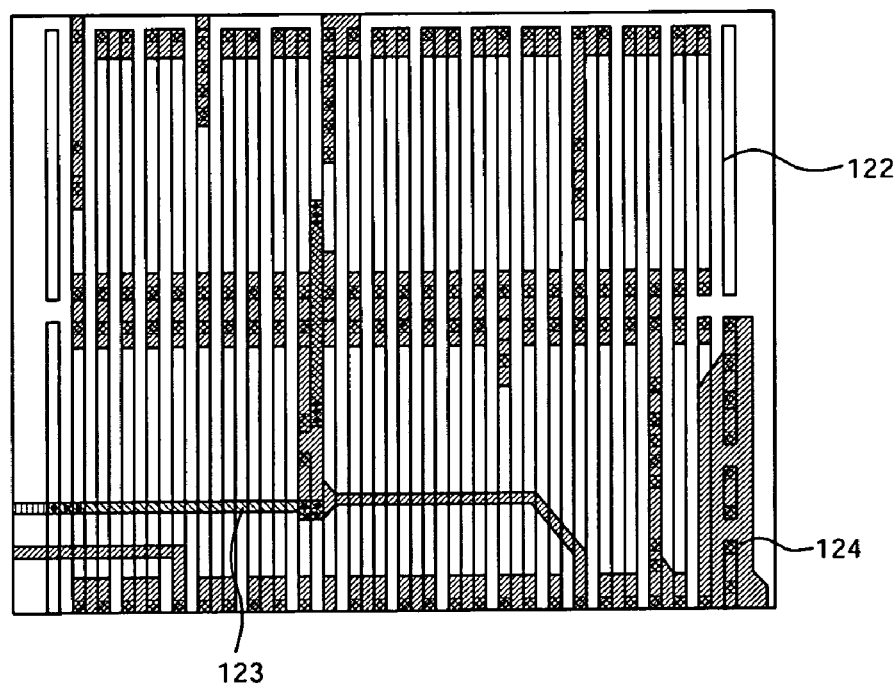

FIG. 4 is a conceptual view showing the construction of the voltage division unit of a voltage regulator according to the present invention.

As shown in FIG. 4, the voltage regulator 100 according to the present invention includes the step of forming the reference voltage generation unit 110 and the amplification unit 130, constituting an analog circuit, and forming the transistor 130, including a P-type implant, an N-type implant, a gate-poly layer, and a contact, the step of forming a plurality of metal wires 122 arranged in regular patterns, and the step of forming metal wiring patterns 124 for connecting the transistor 140 to the metal wires 122 through conductive wires.

Each of the metal wiring patterns 124 is formed such that a thin metal film is stacked on the top of the metal wires 122 and an unnecessary portion is eliminated from the thin metal film through a photolithography process, and thus the metal wiring pattern is formed in a desired shape.

That is, the thin metal film is stacked in such a way that, after a series of manufacturing processes, such as implantation, etching, and LOCal Oxidation of Silicon (LOCOS), has been performed using a photomask so as to form the transistor 140, the gate poly layer, required for the gate of the transistor 140, and the metal wires 122 are formed, and the thin metal film covers the entire surface of the top of the transistor 140 and the metal wires 122.

Next, the metal wiring patterns 124, for activating some metal wires selected from among the metal wires 122 by connecting them to each other, are formed on the thin metal film, together with patterns for enabling the gate, drain and source of the transistor 140 to be connected to external devices, through a photolithography process.

In this case, the thin metal film must be originally stacked on the top of the transistor 140 so as to form the metal patterns for connecting the gate, drain and source of the transistor 140 to external devices, and thus no separate process for forming the metal wiring patterns 124 is added.

Further, in the present invention, the metal wires 122 can be formed before or after the gate poly layer is formed, or can be formed at the time of the formation of the gate poly layer.

Further, the metal wiring pattern 124 formed on the top of the region of the transistor 140 (hereinafter referred to as a 'first metal wiring pattern'), and the metal wiring pattern 124 formed on the top of the region of the metal wires 122 (hereinafter referred to as a 'second metal wiring pattern') are preferably formed on different photomasks.

The reason for this is that the shape of the first metal wiring pattern for the transistor 140 is always uniform, whereas the shape of the second metal wiring pattern for the metal wires 122 must be selectively changed depending on the voltage division ratio of the voltage division unit 120.

At this time, the first metal wiring pattern is preferably formed using a single photomask.

Further, the second metal wiring pattern preferably has a number of photomasks corresponding to the number of cases for the second metal wiring pattern, and is thus formed using a single photomask selected from among the photomasks.

Further, both the first metal wiring pattern and the second metal wiring pattern may be formed on a single photomask.

In this case, a number of photomasks corresponding to the number of cases for the second metal wiring pattern is provided, but the portions of the photomasks, corresponding to the first metal wiring pattern, preferably have the same shape.

The reason for this is that, in an actual device, the metal wires 122 are arranged to be horizontal to the transistor 140, and thus the first metal wiring pattern for the transistor 140 and the second metal wiring pattern for the metal wires 122 are also arranged in the same horizontal space.

FIGS. 5A to 5D are diagrams showing various embodiments in which metal wires are selectively connected to each other using the metal wiring patterns of a voltage regulator according to the present invention.

As shown in FIGS. 5A to 5D, the active resistors 125 in the voltage division unit 120 of the voltage regulator 100 according to the present invention are determined by a plurality of metal wires 122, arranged in regular patterns, and the metal wiring patterns 124, configured to activate the metal wires 122 by selectively connecting the metal wires 122 to each other depending on the output voltage of the voltage regulator 100. The metal wires 122 and the transistor 140 are connected to each other through contacts 123.

As described above, the present invention is advantageous in that a plurality of metal wires, arranged in regular patterns, and metal wiring patterns, adapted to determine an active resistance value from the metal wires depending on each voltage level that is desired to be output, are formed in a stacked structure, thus reducing the size of the chip of the voltage regulator, reducing chip manufacturing costs, and increasing the production yield relative to the amount of material.

Further, the present invention is advantageous in that conventional trimming pads can be omitted from a process of manufacturing a voltage regulator, and both metal wires and metal wiring patterns can be manufactured in a single manufacturing process, so that a separate process for manufacturing trimming pads and a trimming process are not required, thus simplifying a process for manufacturing the chip of a voltage regulator, and reducing the manufacturing costs thereof.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A voltage regulator having an input terminal, an output terminal, and a ground terminal, comprising:
   a reference voltage generation unit for generating a reference voltage from the input terminal;
   a voltage division unit for dividing a voltage of the output terminal using a feedback resistor and active resistors, the active resistors are comprised of a plurality of metal wires arranged in regular patterns and conductive metal wiring patterns configured to activate the metal wires by selectively connecting the metal wires to each other;
   an amplification unit for amplifying a difference between the reference voltage and the divided voltage; and
   a transistor for transferring power, from the input terminal to the output terminal in response to an output voltage of the amplification unit, wherein the metal wires are arranged to be horizontal to the transistor and the metal wires and the transistor are on the same chip.

2. The voltage regulator according to claim 1, wherein:
   the metal wires are formed such that the active resistors of the voltage division unit exhibit a plurality resistance values within a predefined output voltage range of the output terminal,
   the metal wiring patterns are formed to select and connect metal wires to each other depending on a desired output voltage, and
   the metal wires comprise contacts formed on certain portions thereof, thus connecting to the metal wiring patterns through the contacts.

3. A method of manufacturing a voltage regulator, the voltage regulator comprising a reference voltage generation unit, a voltage division unit, an amplification unit, and a transistor, comprising:
   forming a plurality of metal wires for the voltage division unit, the metal wires being arranged in regular patterns to enable activating some of the metal wires according to a needed resistance for the voltage division unit;
   forming a gate, drain and source of the transistor;
   forming a thin metal film on the plurality of metal wires, the gate, drain, and source; and
   forming metal wiring patterns by removing portions of the thin metal film for connecting the gate, drain and source of the transistor, and for activating some of the metal wires so that the voltage division unit has the needed resistance.

4. The method according to claim 3, wherein the metal wiring patterns are formed such that a first metal wiring pattern is formed on a region of the transistor, and a second metal wiring pattern is formed on a region of the metal wires and the contacts.

5. The method of claim 3, wherein forming metal wiring patterns further comprises:
   forming metal wiring patterns by removing portions of the thin metal film with two masks, one mask for connecting the gate, drain, and source of the transistor, and a second mask for activating some of the metal wires so that the voltage division unit has the resistance value need.

6. The method of claim 3, further comprising:
forming a plurality of metal wires photo masks one for each of a plurality of needed resistances for the voltage division unit;
forming a transistor photo mask for the gate, drain, and source;
selecting one of the plurality of metal wires photo masks according to the needed resistance for the voltage division unit;
selecting the transistor photo mask; and
using the selected transistor photo mask and the selected one of the plurality of metal wires photo masks for forming metal wiring patterns.

7. The method of claim 3, wherein the metal wires are arranged to be horizontal to the transistor.

8. The method of claim 3, further comprising:
forming a plurality of photo masks one for each of a plurality of needed resistances for the voltage division unit, wherein each of the plurality of photo masks includes an area for connecting the gate, drain, and source;
selecting one of the plurality of photo masks according to the needed resistance for the voltage division unit; and
using the selected one of the plurality of photo masks for forming metal wiring patterns to connect gate, drain, and source, and to activate some of the metal wires so that the voltage division unit has the needed resistance.

9. A method of manufacturing a voltage regulator, the voltage regulator comprising a reference voltage generation unit, a voltage division unit, an amplification unit, and a transistor, comprising:
forming a plurality of metal wires for the voltage division unit, the metal wires being arranged in regular patterns to enable activating some of the metal wires according to a needed resistance of the voltage division unit;
forming a gate, drain and source of the transistor, wherein the gate, drain, and source of the transistor are formed on the same chip as the plurality of metal wires; and
forming metal wiring patterns for connecting the gate, drain and source of the transistor, and for activating some of the metal wires so that the voltage division unit has the needed resistance.

* * * * *